US012660122B2

(12) United States Patent

Joshi et al.

(10) Patent No.: US 12,660,122 B2

(45) Date of Patent: Jun. 16, 2026

(54) RECTIFIER DIODE ASSEMBLY

(71) Applicant: Hamilton Sundstrand Corporation, Charlotte, NC (US)

(72) Inventors: Ashutosh Joshi, Roscoe, IL (US); Eric A. Carter, Monroe, WI (US); Coralyn J. Saxby, Davis, IL (US); Randy P. Gauvin, Beloit, WI (US); Dhaval S. Patel, Schaumburg, IL (US); Michael J. DeVito, Loves Park, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 335 days.

(21) Appl. No.: 18/295,929

(22) Filed: Apr. 5, 2023

(65) Prior Publication Data

US 2024/0341059 A1 Oct. 10, 2024

(51) Int. Cl.
| | |
|---|---|
| *H05K 7/20* | (2006.01) |
| *H02G 5/02* | (2006.01) |
| *H02M 7/00* | (2006.01) |

(52) U.S. Cl.
CPC ........... *H05K 7/20272* (2013.01); *H02G 5/02* (2013.01); *H02M 7/003* (2013.01)

(58) Field of Classification Search
CPC ..... H05K 7/20272; H02G 5/02; H02M 7/003; H02K 9/19; H02K 9/223; H02K 11/05; H01L 23/3677; H01L 23/44; H01L 23/473
See application file for complete search history.

(56) References Cited

U.S. PATENT DOCUMENTS

| | | | | |
|---|---|---|---|---|
| 3,521,132 | A | * | 7/1970 | Petersen ................. H01L 25/03 |
| | | | | 257/722 |
| 5,119,175 | A | | 6/1992 | Long et al. |
| 5,854,739 | A | * | 12/1998 | Steiner .................... F21V 29/74 |
| | | | | 174/16.3 |
| 6,090,642 | A | * | 7/2000 | Kamibayashi ........ H01S 5/0232 |
| | | | | 438/121 |
| 6,433,370 | B1 | * | 8/2002 | Metzler ................ H10D 84/221 |
| | | | | 257/E29.022 |
| 7,916,480 | B2 | | 3/2011 | Woody et al. |

(Continued)

FOREIGN PATENT DOCUMENTS

| | | |
|---|---|---|
| JP | 2022129917 A | 9/2022 |

OTHER PUBLICATIONS

European Search Report for Application No. 24168552.8, mailed Sep. 10, 2024, 9 pages.

(Continued)

*Primary Examiner* — Jacob R Crum

(74) *Attorney, Agent, or Firm* — CANTOR COLBURN LLP

(57) ABSTRACT

A rectifier diode assembly is provided and includes first and second bus bars, a diode interposed between the first and second bus bars to define first and second spaces for fluid flow between the diode and the first and second bus bars, respectively, and first and second louvers. The first louvers are compressively interposed between the first bus bar and the diode to extend across the first space for thermally and electrically connecting the first bus bar and the diode. The second louvers are compressively interposed between the second bus bar and the diode to extend across the second space for thermally and electrically connecting the second bus bar and the diode.

12 Claims, 7 Drawing Sheets

(56) References Cited

U.S. PATENT DOCUMENTS

| | | | | |
|---|---|---|---|---|
| 7,952,875 | B2 | 5/2011 | Woody et al. | |
| 2007/0053168 | A1* | 3/2007 | Sayir ..................... | H01L 23/367 |
| | | | | 257/E23.105 |
| 2015/0200147 | A1* | 7/2015 | Lien ........................ | H01L 21/56 |
| | | | | 257/678 |
| 2016/0226348 | A1 | 8/2016 | Rittmeyer | |
| 2024/0072179 | A1* | 2/2024 | Arima ................... | H10D 8/605 |

OTHER PUBLICATIONS

EP Communication pursuant to Article 94(3) EPC corresponding to EP Application No. 24 168 552.8; Issue date, Feb. 19, 2026, 8 pages.

\* cited by examiner

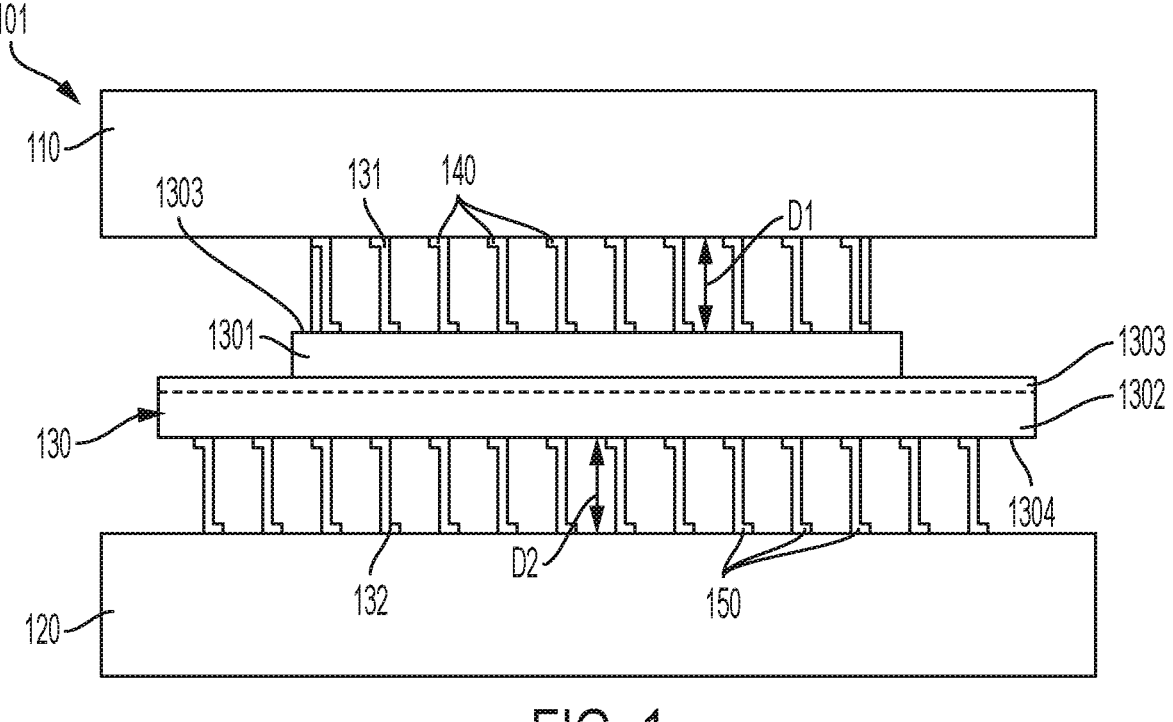
FIG. 1
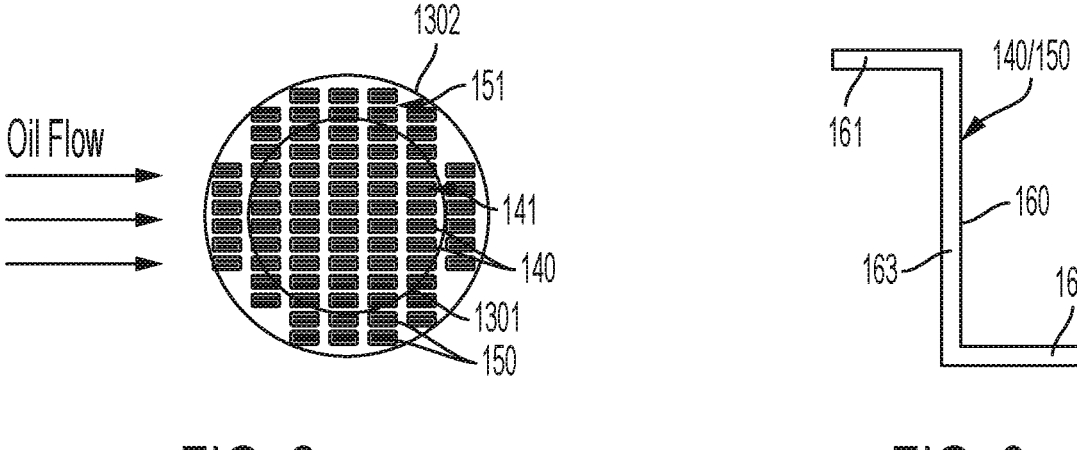
FIG. 2
FIG. 3

RECTIFIER DIODE ASSEMBLY

BACKGROUND

The present disclosure relates to a rectifier diode assembly and, in particular, to cooling of a rectifier diode assembly and an integrated rectifier diode assembly.

Aircraft generator rectifier assemblies generally include diodes packaged in modules, with a die mounted to a substrate and the substrate mounted in turn to a cold plate through which oil circulates. Fins can be added to the cooling path to improve cooling performance, as well as other modifications that often do not substantially improve performance, and which sometimes negatively impact overall weight. Occasionally, this relatively inefficient arrangement can result in a very low or even negative thermal margin, when under high power load with a hot cooling oil condition. For silicon-based diodes in particular, another issue is that cooling can be limited by a maximum die temperature.

A need therefore remains for improved cooling of a rectifier diode assembly and for an improved integrated rectifier diode assembly.

SUMMARY

According to an aspect of the invention, a rectifier diode assembly is provided and includes first and second bus bars, a diode interposed between the first and second bus bars to define first and second spaces for fluid flow between the diode and the first and second bus bars, respectively, and first and second louvers. The first louvers are compressively interposed between the first bus bar and the diode to extend across the first space for thermally and electrically connecting the first bus bar and the diode. The second louvers are compressively interposed between the second bus bar and the diode to extend across the second space for thermally and electrically connecting the second bus bar and the diode.

In accordance with additional or alternative embodiments, the first and second bus bars define outer walls of a fluid chamber and the fluid flow includes cooling fluid entering the fluid chamber for distribution about and around the first and second louvers.

In accordance with additional or alternative embodiments, the fluid flow includes an oil flow.

In accordance with additional or alternative embodiments, the diode includes a first electrode facing the first bus bar at a first distance to define the first space, a second electrode facing the second bus bar at a second distance to define the second space and dielectric material interposed between the first and second electrodes.

In accordance with additional or alternative embodiments, the first electrode includes an anode and the second electrode includes a cathode.

In accordance with additional or alternative embodiments, the first electrode includes a first surface facing the first bus bar with the first louvers arranged across the first surface and the second electrode includes a second surface facing the second bus bar with the second louvers arranged across the second surface.

In accordance with additional or alternative embodiments, the first and second louvers are arranged across the first and second surfaces in row-column lattice formations.

In accordance with additional or alternative embodiments, the first and second electrodes are annular and the second electrode has a larger diameter than the first electrode.

According to an aspect of the disclosure, a rectifier diode assembly is provided and includes first bus bars, a second bus bar interposed between the first bus bars, diodes interposed between the second bus bar and each of the first bus bars to define pairs of first and second spaces for fluid flow between the diodes and the first bus bars and between the diodes and the second bus bar, respectively, and first and second louvers. Then first louvers are compressively interposed between each of the first bus bars and the diodes to extend across the first spaces for thermally and electrically connecting each of the first bus bars and the diodes. The second louvers are compressively interposed between the second bus bar and the diodes to extend across the second spaces for thermally and electrically connecting the second bus bar and the diodes.

In accordance with additional or alternative embodiments, the first bus bars define outer walls of a fluid chamber and the fluid flow includes cooling fluid entering the fluid chamber for distribution about and around the first and second louvers.

In accordance with additional or alternative embodiments, the fluid flow includes an oil flow.

In accordance with additional or alternative embodiments, the diodes each includes a first electrode facing a corresponding one of the first bus bars at a first distance to define the first space, a second electrode facing the second bus bar at a second distance to define the second space and dielectric material interposed between the first and second electrodes.

In accordance with additional or alternative embodiments, the first electrode includes an anode and the second electrode includes a cathode.

In accordance with additional or alternative embodiments, the first electrode includes a first surface facing the corresponding one of the first bus bars with the first louvers arranged across the first surface and the second electrode includes a second surface facing the second bus bar with the second louvers arranged across the second surface.

In accordance with additional or alternative embodiments, the first and second louvers are arranged across the first and second surfaces in row-column lattice formations.

In accordance with additional or alternative embodiments, the first and second electrodes are annular and the second electrode has a larger diameter than the first electrode.

According to an aspect of the disclosure, a generator environment with an integrated rectifier diode assembly is provided. The generator environment includes a generator housing including a generator section and a sump section and a rectifier diode assembly secured to the generator housing in the sump section. The rectifier diode assembly is oil-cooled by oil collected in the sump section.

In accordance with additional or alternative embodiments, the rectifier diode assembly includes multiple diodes and bus bars forming a housing in which the multiple diodes are disposable and being configured to route the oil around the multiple diodes.

In accordance with additional or alternative embodiments, the multiple diodes are compressed between the bus bars.

In accordance with additional or alternative embodiments, the bus bars are formed to define heat transfer channels.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIG. 1 is a side view of a rectifier diode assembly in accordance with embodiments;

FIG. 2 is a top-down view of the rectifier diode assembly of FIG. 1 in accordance with embodiments;

FIG. 3 is an enlarged side view of a louver of the rectifier diode assembly of FIG. 1 in accordance with embodiments;

DETAILED DESCRIPTION

Figure 4:
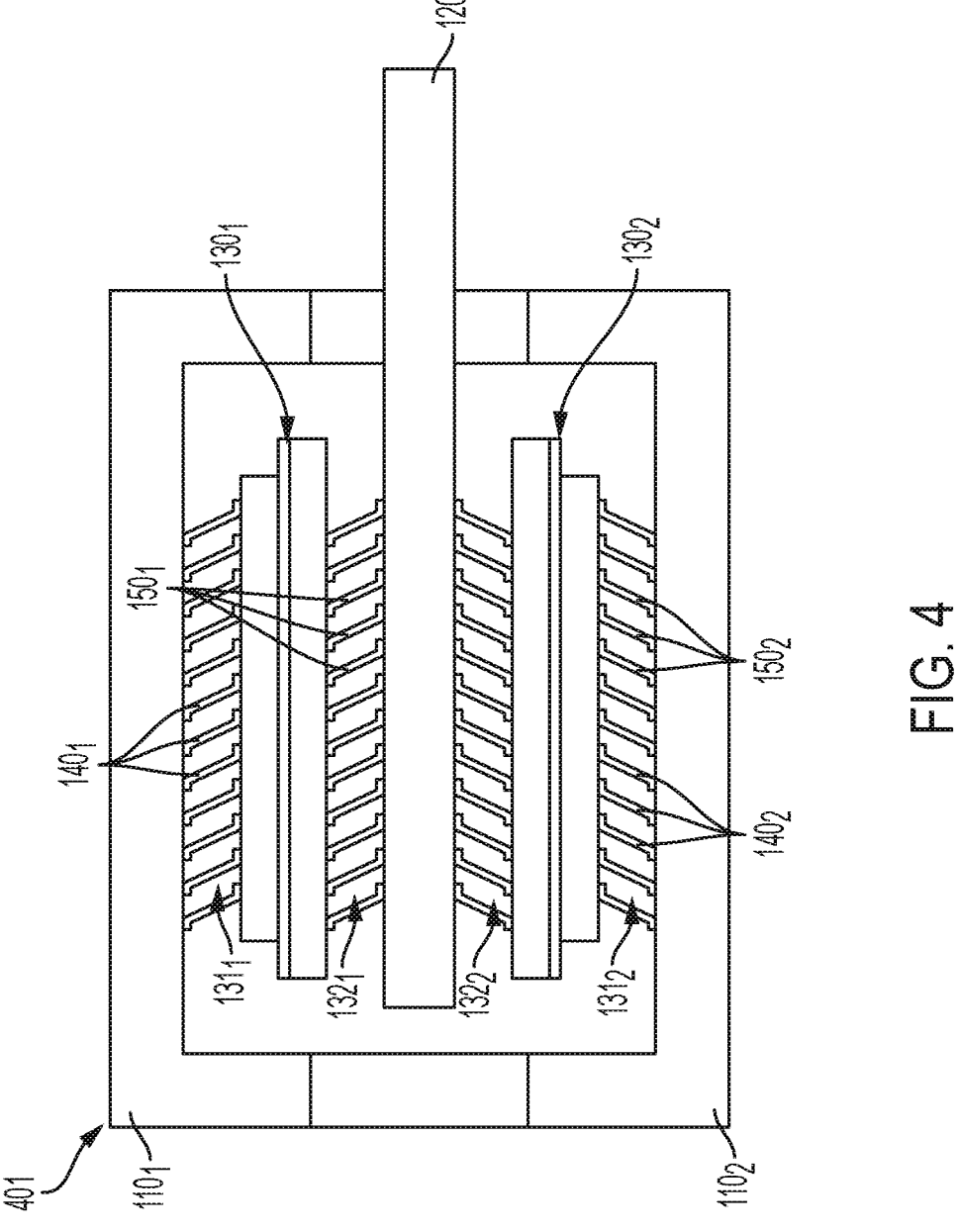
FIG. 4 is a side view of a rectifier diode assembly in accordance with further embodiments.

In aircraft generator rectifier assemblies, power electronics typically need to be mounted very close to the generator. High temperature oil is used to cool the generator and the same oil is often used for rectifier cooling as well. The power electronics are rated to a lower junction temperature than generator winding temperature limits (insulation life) and heat flux in the power electronics (diode) devices can be very high so efficient cooling is needed. Also, the unit needs to be light weight due to overall system weight requirements for aircraft applications. When high power loading and hot cooling oil conditions are in effect there can be very low or negative thermal margins which can result in reduced system reliability.

Current solutions to the problem of forming aircraft generator rectifier assemblies include diodes being packaged in a module where a die is mounted to a substrate and the substrate is mounted to a cold plate. The cold plate is cooled using circulating oil but often has a large thermal mass. The diodes can be integrated to the cold plate to reduce contact thermal resistance (and contact electrical resistance) but this can result in inefficient cooling. In any case, the current solutions tend to have large unit weights due to packaging.

In addition to the above concerns, the current solutions may require a "dry bay" cavity inside a generator housing since generator connections to a rectifier need to be sealed to prevent leakage. In these cases, the bus bars and capacitors are conduction cooled by the generator housing.

Thus, as will be described below, a rectifier assembly is proposed that has a diode compressed between bus bars using multi-contact louvers. Cooling oil is flown around the diode and between the multi-contacts louvers. The multi-contact louvers are used to connect the diodes electrically to the bus bars, with alternating current (AC) on one side and direct current (DC) on other side. The louvers can be placed under compression to thereby make good contact with the bus bars and with the diode tabs to transfer heat and current. A number of contacts are optimized for thermal, mechanical and electrical performance by making per-contact current lower and thus reducing joule heating and by providing increased surface area for heat transfer.

In addition, as will be described below, an integrated rectifier assembly is provided and includes bus bars that form a housing containing individual diodes and that are used to route oil around the diodes and a diode that is compressed using bus bars on both a cathode side and an anode side using washers/springs and in which cooling oil is flown through the assembly and around the diodes. Heat transfer channels in the bus bars improve cooling and packaging for oil immersion no longer requires the generator to have a dry cavity and associated interconnects.

With reference to FIGS. 1-3, a rectifier diode assembly 101 is provided and includes a first bus bar 110, a second bus bar 120 and a diode 130 that is interposed between the first bus bar 110 and the second bus bar 120. The diode 130 includes a first electrode 1301 that faces the first bus bar 110 at a first distance D1, a second electrode 1302 that faces the second bus bar 120 at a second distance D2 and dielectric material 1303 interposed between the first electrode 1301 and the second electrode 1302. The first electrode 1301 can include or be provided as an anode with a coefficient of thermal expansion (CTE) matching silicon. The second electrode 1302 can include or be provided as a cathode with a CTE matching silicon.

With the diode 130 interposed between the first bus bar 110 and the second bus bar 120, the first electrode 1301 of the diode 130 faces the first bus bar 110 at the first distance D1 to define a first space 131 for fluid flow (i.e., dielectric coolant flow) between the first electrode 1301 of the diode 130 and the first bus bar 110 and the second electrode 1302 of the diode 130 faces the second bus bar 120 at the second distance D2 to define a second space 132 for fluid flow between the second electrode 1302 of the diode 130 and the second bus bar 120. The rectifier diode assembly 101 further includes first louvers 140 and second louvers 150. The first louvers 140 are compressively interposed between the first bus bar 110 and the diode 130 to extend across the first space 131 for thermally and electrically connecting the first bus bar 110 and the diode 130. The second louvers 150 are compressively interposed between the second bus bar 120 and the diode 130 to extend across the second space 132 for thermally and electrically connecting the second bus bar 120 and the diode 130. The first bus bar 110 and the second bus bar 120 thus define outer walls of a fluid chamber 135. The fluid flow can include cooling fluid, such as an oil flow, that enters the fluid chamber 135 for distribution about and around the first louvers 140 and about and around the second louvers 150.

The first electrode 1301 can include a first surface 1303 that faces the first bus bar 110 with the first louvers 140 arranged across the first surface 1303. The first louvers 140 can be arranged in multiple formations including, but not limited to, a row-column lattice 141 (see FIG. 2) in which the first louvers 140 form rows and columns of louvers. The second electrode 1302 can include a second surface 1304 that faces the second bus bar 120 with the second louvers 150 arranged across the second surface 1304. The second louvers 150 can be arranged in multiple formations including, but not limited to, a row-column lattice 151 (see FIG. 2) in which the second louvers 150 form rows and columns of louvers. The first electrode 1301 and the second electrode 1302 can have various shapes including, but not limited to, annular shapes, with the second electrode 1302 having a larger diameter than the first electrode 1301.

With reference to FIG. 3, each of the first louvers 140 and each of the second louvers 150 can be provided as a spring element 160 with a first pad section 161, a second pad section 162 and a leaf section 163 that extends between corresponding ends of the first pad section 161 and the second pad section 162. For each of the first louvers 140, the first pad section 161 is attachable to the first bus bar 110 and the second pad section 162 is attachable to a proximal pad of the first electrode 1301. Compression of the first bus bar 110 toward the first electrode 1301 is absorbed by each of the first louvers 140 whereby each of the first louvers 140 makes good and reliable contact with both the first bus bar 110 and the proximal pads of the first electrode 1301. For each of the second louvers 150, the first pad section 161 is attachable to the second bus bar 120 and the second pad section 162 is attachable to a proximal pad of the second electrode 1302. Compression of the second bus bar 120 toward the second electrode 1302 is absorbed by each of the second louvers 150 whereby each of the second louvers 150 makes good and reliable contact with both the second bus bar 120 and the proximal pads of the second electrode 1302.

The first louvers 140 and the second louvers 150 can be provided to make rectification happen with the first louvers 140 bringing alternating current (AC) to the first electrode 1301 and the second louvers 150 bringing direct current (DC) to the second electrode 1302 and vice versa.

The first and second louvers 140 and 150 can be formed of copper materials with gold or silver plating. The numbers of the first and second louvers 140 and 150 can be optimized for optimum thermal, mechanical and electrical performance.

With reference to FIG. 4, a rectifier diode assembly 401 is provided and includes similar features as noted above, which need not be described again except as provided below. The rectifier diode assembly 401 includes upper and lower first bus bars 1101 and 1102, a second bus bar 120 that is interposed between the upper and lower first bus bars 1101 and 1102 and upper and lower diodes 1301 and 1302. The upper diode 1301 is interposed between the second bus bar 120 and the upper bus bar 1101 and the lower diode 1302 is interposed between the second bus bar 120 and the lower bus bar 1102. The upper diode 1301 and the lower diode 1302 thus define pairs of upper and lower first spaces 1311 and 1312 and upper and lower second spaces 1321 and 1322 for fluid flow. A set of upper first louvers 1401 are compressively interposed between the upper first bus bar 1101 and the upper diode 1301 to extend across the upper first space 1311 for thermally and electrically connecting the upper first bus bar 1101 and the upper diode 1301. A set of lower first louvers 1402 are compressively interposed between the lower first bus bar 1102 and the lower diode 1302 to extend across the lower first space 1312 for thermally and electrically connecting the lower first bus bar 1102 and the lower diode 1302. A set of upper second louvers 1501 are compressively interposed between the upper diode 1301 and the second bus bar 120 to extend across the upper second space 1321 for thermally and electrically connecting the upper diode 1301 and the second bus bar 120. A set of lower second louvers 1502 are compressively interposed between the second bus bar 120 and the lower diode 1302 to extend across the lower second space 1322 for thermally and electrically connecting the second bus bar 120 and the lower diode 1302.

With reference to FIGS. 5-9, an oil-cooled rectifier diode assembly 1200 (see FIG. 7) is provided and includes a middle or intermediate bus bar 720 including stacked plates 720a, 720b having cooling channels 525a, 525b, 525c formed therein. The stacked plate 720a includes, extending off of connectors 723, power connections 727. The power connections 727 are configured to receive insulators 729 to allow the power connections 727 to pass through adjacent bus bars (particularly first outer bus bar 810) having different polarity. Sealing elements, in this case, O-rings 728 are provided to seal against the outer portions of the assembly. In this manner, loss of cooling fluid from the internal passageways is reduced, and component cooling is enhanced.

Diodes, such as those described above, are provided respectively on upper and lower faces of the intermediate bus bar 720.

Figure 5:
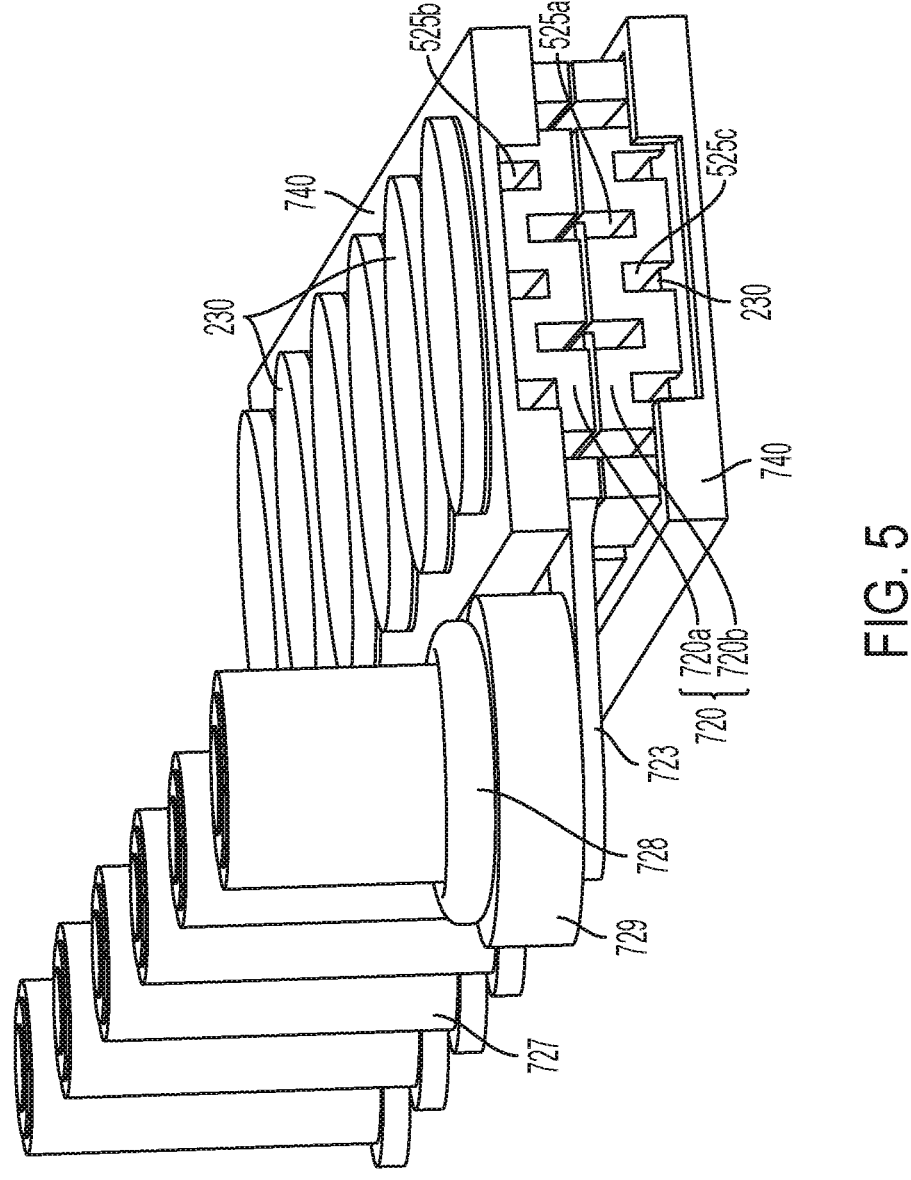
FIG. 5 is a perspective view of a rectifier diode assembly and bus bars in accordance with embodiments.
Figure 7:
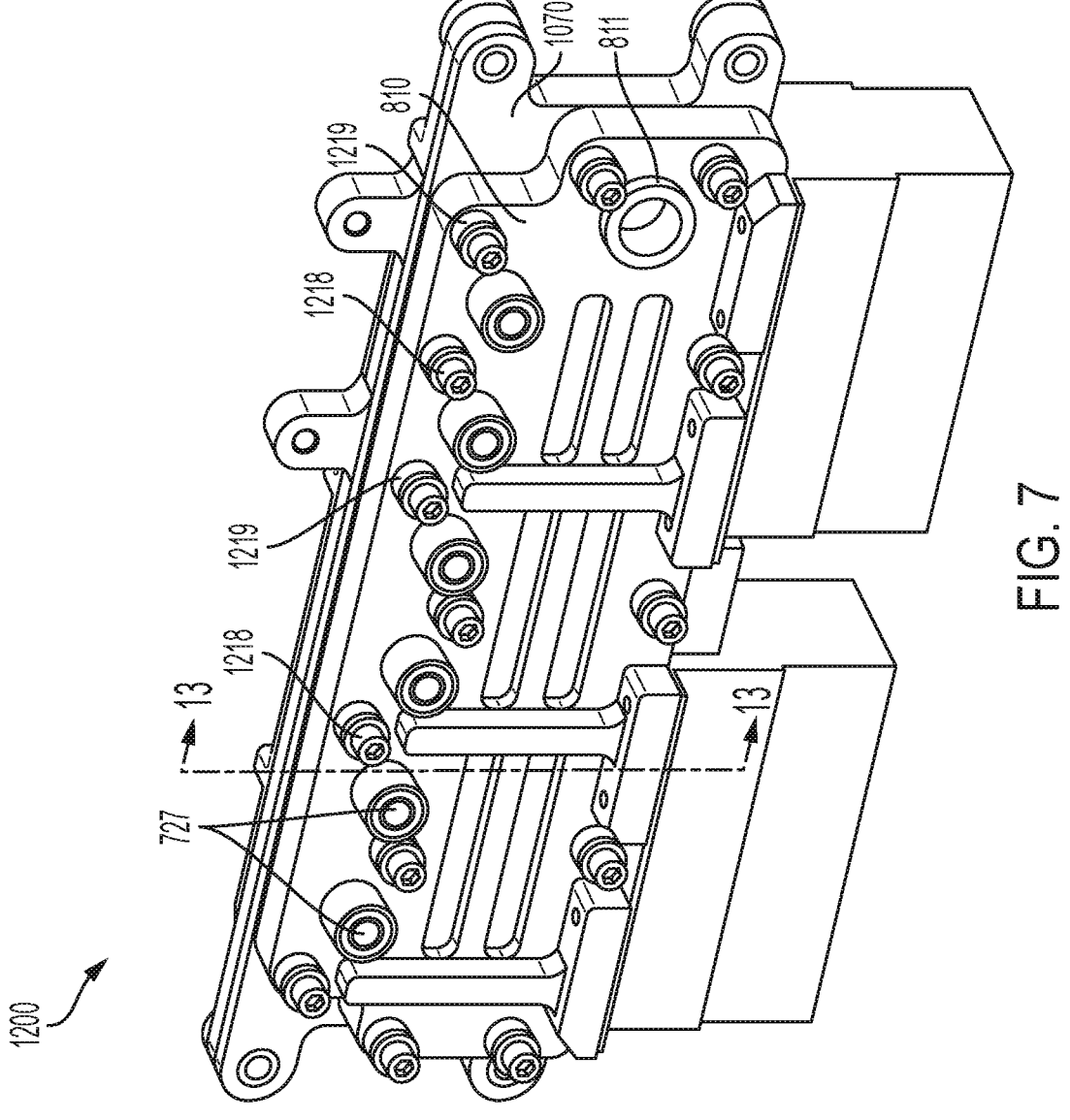
FIG. 7 is a perspective view of a combined bus bar assembly in accordance with embodiments.

The assembly of FIG. 5 is essentially held within outer bus bars 810 and 1070 of FIG. 7, which form a fluid path around and through the assembly of FIG. 5. In that manner, upper diodes are arranged in a first array between outer bus bar 810 and inner bus bar 720\ and lower diodes are arranged in a second array between the inner bus bar 720 and the outer bus bar 1070.

Figure 6:
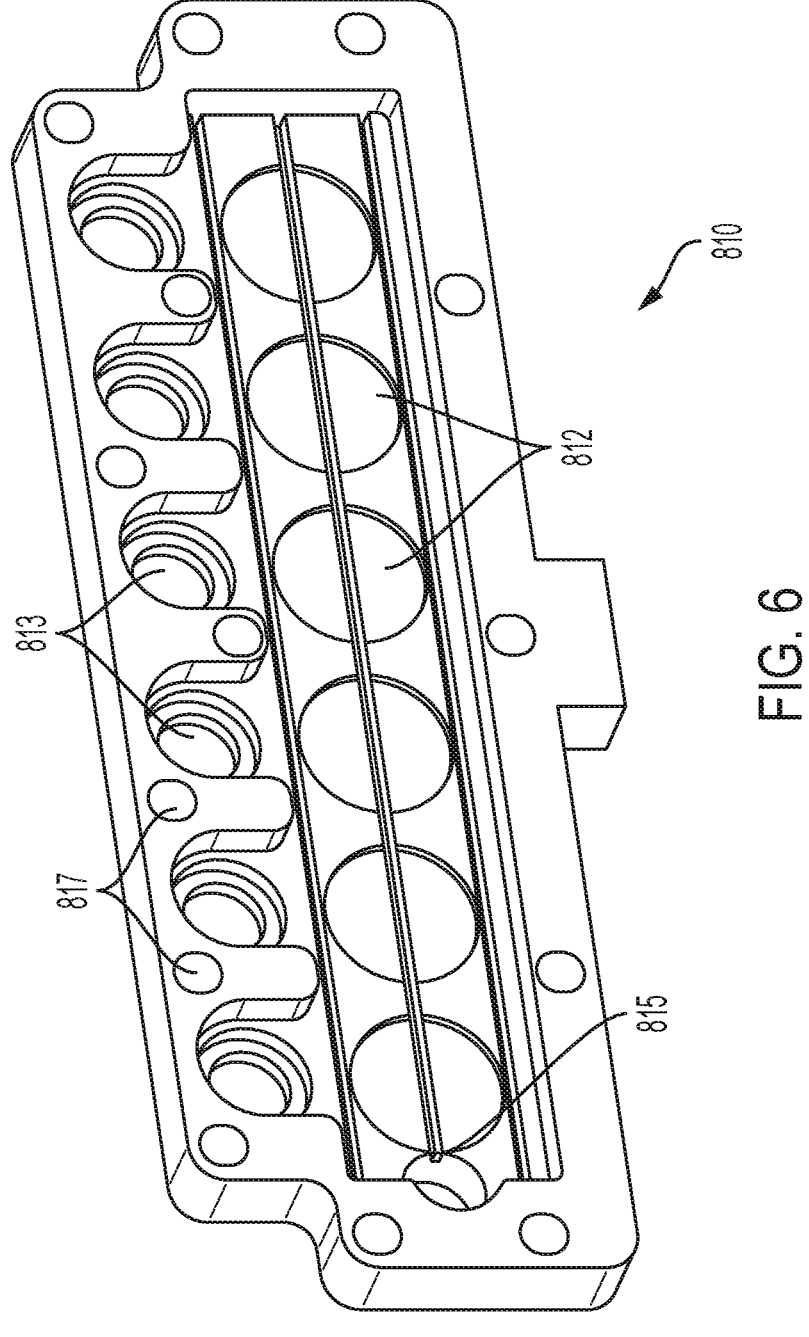
FIG. 6 is a perspective view of a bus bar in accordance with embodiments.

As shown in FIG. 6, the first outer bus bar 810 includes fluid channels 815 formed therein. The first outer bus bar 810 can optionally include a parting sheet to optimize fluid flow characteristics along upper surfaces of the diodes 230. Similarly, the inner bus bar 720 includes the fluid channels 525a, 525b, 525c. The inner bus bar 720 can optionally include a parting sheet to close the upper end of fluid channel 525b and another parting sheet can be applied to the lower end of fluid channels 525c to optimize fluid flow characteristics. The third bus bar can includes fluid channels as well and a parting sheet to optimize fluid flow characteristics.

The bus bars 810, 720 and 1070 can be formed by any suitable techniques, including but not limited to casting, extrusion and/or machining. Further the bus bars 810, 720 and 1070 can each be formed of a single piece or by joining multiple pieces together. The bus bars 810, 720 and 1070 can be formed out of any preferably highly thermally and electrically conductive material.

An insulating material 740 can be provided to stabilize the diodes, which itself can have cooling channels formed therethrough. Alternatively, the areas occupied by the insulating material 740 can be left open to allow free passage of cooling fluid over the exposed surfaces of the diodes.

Also, the diodes of one array can be flipped with respect to the diodes of the opposing array so that the polarity allows sharing of the intermediate bus bar 720, leaving the outer bus bars 810 and 1070 with a common opposite polarity.

As shown in FIGS. 6 and 7, cooling fluid inlet port 811 and various cutouts 813 allow for passage of opposing bus bar power connections 727 and their insulators 729. Bolt holes 817 are also provided. An integral cooling fluid channel 815 and surface contours 812 can serve to enhance mechanical, thermal and electrical connection to adjacent diodes.

Figures 8, 9:
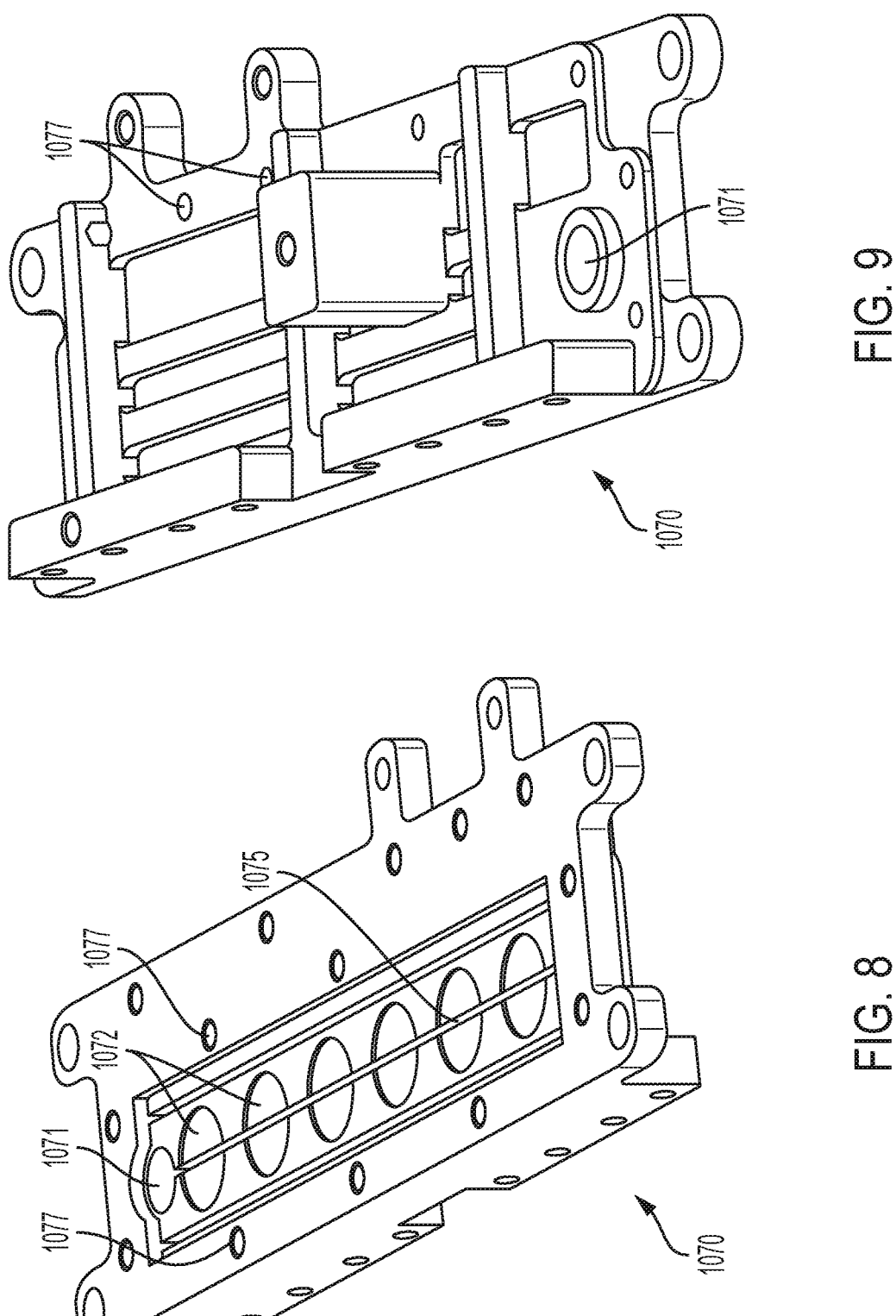
FIG. 8 is a perspective view of an inner surface of a second bus bar in accordance with embodiments.
FIG. 9 is a perspective view of an outer surface of a second bus bar in accordance with embodiments.

FIGS. 8 and 9 are isometric views of inner and outer surfaces of the second outer bus bar 1070, respectively. An integral cooling fluid channel 1075 and surface contours 1072 are provided to enhance mechanical, thermal and electrical connection to adjacent diodes. Bolt holes 1077 are also provided, along with cooling fluid outlet port 1071.

Also shown in FIG. 7 are assembly bolts 1218 and biasing members 1219 that are used to maintain contact force within the assembly between bus bars 720, 810 and 1070 and the diodes. The biasing members 1219 can be any suitable resilient material, such as a spring or elastomeric washer, for example. The assembly bolts 1218 pass from first outer bus bar 810, through to the opposing second outer bus bar 1070, and compress biasing members 1219 in the process, which maintains contact force between the diodes and the bus bars 720, 810 and 1070.

Figure 11:
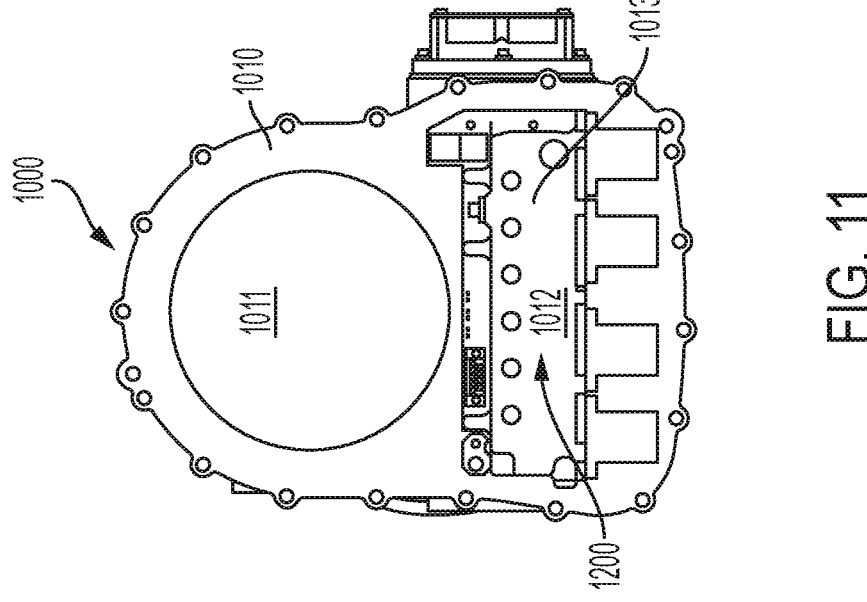
FIG. 11 is an axial view of a generator environment with an integrated rectifier diode assembly in accordance with embodiments.
Figure 10:
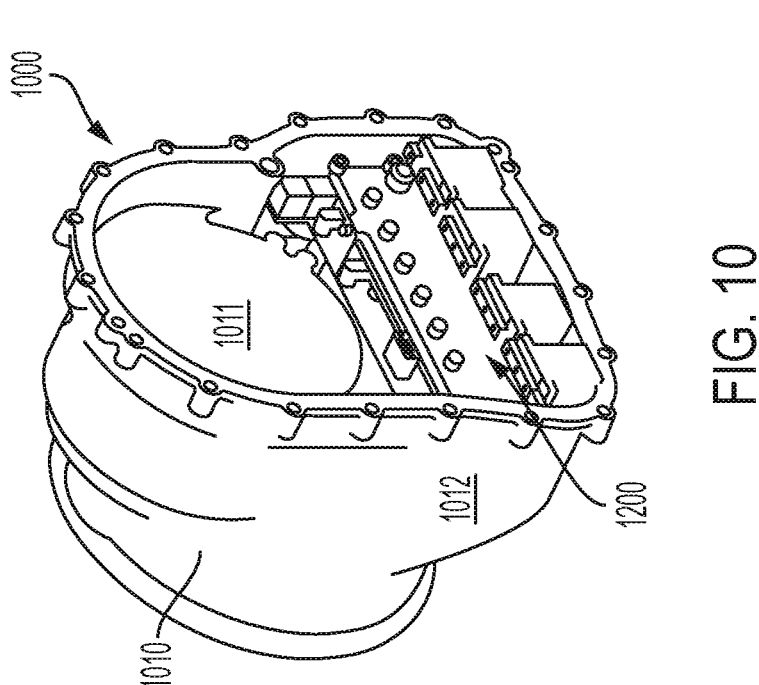
FIG. 10 is a perspective view of a generator environment with an integrated rectifier diode assembly in accordance with embodiments.

With reference to FIGS. 10 and 11, the entire rectifier diode assembly 1200 can be wetted in engine sump oil to enhance cooling, depending on the application to form a generator environment 1000 with an integrated rectifier diode assembly. The generator environment 1000 includes a generator housing 1010, which includes a generator section 1011 and a sump section 1012, a rectifier diode assembly 1020 that is secured to the generator housing 1010 in the sump section 1012, the rectifier diode assembly 1020 being oil-cooled by oil collected in the sump section 1012. The rectifier diode assembly 1020 includes multiple diodes as described above and bus bars 1013. The bus bars 1013 form a housing in which the multiple diodes are disposable and are configured to route the oil around the multiple diodes. The multiple diodes can be compressed between the bus bars 1013 and the bus bars 1013 can be formed to define heat transfer channels.

Technical effects and benefits of the present disclosure are the provision of a rectifier assembly that is cooled with oil that is used to cool a generator as well in an integrated electronics generator system, a rectifier diode assembly that is wetted in sump oil, multi-contact louvers (made from copper) that are used between diode tabs and bus bars for electrical and thermal contacts. Due to the spring nature of the multi-contact louvers, the diode and bus bars are provided in good and reliable electrical and thermal contact. Also, since multiple louvers are used, current per contact and thereby heat generation due to Joule heating is reduced. This provided significant improvement to cooling of the diode due to direct cooling at the diode die level.

In addition, the integrated rectifier assembly is directly cooled with generator oil. Diodes have oil flowing over all sides, allowing heat transfer directly to the oil. No additional packaging is needed to mount/cool the diodes, eliminating the custom diode module and associated interconnections. Bus bars, capacitors and other components sit directly in oil allowing for more efficient heat transfer compared to the dry bay conduction cooled design. This allows for additional size and weight reduction. Electronic components are integrated into generator cavity reducing weight/size of interconnection between the generator and the rectifier. Bus bars form the housing around the diodes and define the oil cooling channels. No additional components are needed to connect to the diodes or route oil flow. This provides reduced part count and simplification of the generator housing. The integrated rectifier assembly removes the need for development, design and qualification of a custom diode module, reducing overall system cost and schedule.

The corresponding structures, materials, acts, and equivalents of all means or step-plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A rectifier diode assembly, comprising:
first and second bus bars;
a diode interposed between the first and second bus bars to define first and second spaces for fluid flow between the diode and the first and second bus bars, respectively;
first louvers compressively interposed between the first bus bar and the diode to extend across the first space for thermally and electrically connecting the first bus bar and the diode; and
second louvers compressively interposed between the second bus bar and the diode to extend across the second space for thermally and electrically connecting the second bus bar and the diode,
wherein the diode comprises:
a first annular electrode comprising a first electrode first surface, across which the first louvers are arranged in a first row-column lattice formation, facing the first bus bar at a first distance to define the first space and a first electrode second surface facing in an opposite direction from the first electrode first surface;
a second annular electrode having a larger diameter than the first electrode and comprising a second electrode second surface, across which the second louvers are arranged in a second row-column lattice formation having a larger footprint than the first row-column lattice formation, facing the second bus bar at a second distance to define the second space and a second electrode first surface facing in an opposite direction from the second electrode second surface; and
dielectric material interposed between and disposed in contact with the first electrode second surface and the second electrode first surface.

2. The rectifier diode assembly according to claim 1, wherein:
the first and second bus bars define outer walls of a fluid chamber, and
the fluid flow comprises cooling fluid entering the fluid chamber for distribution about and around the first and second louvers.

3. The rectifier diode assembly according to claim 1, wherein the fluid flow comprises an oil flow.

4. The rectifier diode assembly according to claim 1, wherein the first electrode comprises an anode and the second electrode comprises a cathode.

5. A rectifier diode assembly, comprising:
first bus bars;
a second bus bar interposed between the first bus bars;
diodes interposed between the second bus bar and each of the first bus bars to define pairs of first and second spaces for fluid flow between the diodes and the first bus bars and between the diodes and the second bus bar, respectively;

first louvers compressively interposed between each of the first bus bars and the diodes to extend across the first spaces for thermally and electrically connecting each of the first bus bars and the diodes; and second louvers compressively interposed between the second bus bar and the diodes to extend across the second spaces for thermally and electrically connecting the second bus bar and the diodes, wherein each of the diodes comprises:

a first annular electrode comprising a first electrode first surface, across which the first louvers are arranged in a first row-column lattice formation, facing a corresponding one of the first bus bars at a first distance to define a corresponding one of the first spaces and a first electrode second surface facing in an opposite direction from the first electrode first surface;

a second annular electrode having a larger diameter than the first electrode and comprising a second electrode second surface, across which the second louvers are arranged in a second row-column lattice formation having a larger footprint than the first row-column lattice formation, facing a corresponding one of the second bus bars at a second distance to define a corresponding one of the second spaces and a second electrode first surface facing in an opposite direction from the second electrode second surface; and dielectric material interposed between and disposed in contact with the first electrode second surface and the second electrode first surface.

6. The rectifier diode assembly according to claim 5, wherein:

the first bus bars define outer walls of a fluid chamber, and the fluid flow comprises cooling fluid entering the fluid chamber for distribution about and around the first and second louvers.

7. The rectifier diode assembly according to claim 5, wherein the fluid flow comprises an oil flow.

8. The rectifier diode assembly according to claim 5, wherein the first electrode comprises an anode and the second electrode comprises a cathode.

9. A generator environment with an integrated rectifier diode assembly, comprising:

a generator housing comprising a generator section and a sump section; and a rectifier diode assembly according to the rectifier diode assembly of claim 1 secured to the generator housing in the sump section, the rectifier diode assembly being oil-cooled by oil collected in the sump section.

10. The generator environment according to claim 9, wherein the rectifier diode assembly comprises:

multiple diodes; and bus bars forming a housing in which the multiple diodes are disposable and being configured to route the oil around the multiple diodes.

11. The generator environment according to claim 10, wherein the multiple diodes are compressed between the bus bars.

12. The generator environment according to claim 10, wherein the bus bars are formed to define heat transfer channels.

* * * * *